United States Patent
Kaneko et al.

(10) Patent No.: US 6,503,669 B2
(45) Date of Patent: Jan. 7, 2003

(54) PHOTOMASK BLANK, PHOTOMASK AND METHOD OF MANUFACTURE

(75) Inventors: Hideo Kaneko, Nakakubiki-gun (JP); Yukio Inazuki, Nakakubiki-gun (JP); Tamotsu Maruyama, Nakakubiki-gun (JP); Satoshi Okazaki, Nakakubiki-gun (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 129 days.

(21) Appl. No.: 09/783,322

(22) Filed: Feb. 15, 2001

(65) Prior Publication Data

US 2001/0019801 A1 Sep. 6, 2001

(30) Foreign Application Priority Data

Feb. 16, 2000 (JP) .......................... 2000-037822

(51) Int. Cl.$^7$ .............................. G03F 9/00; C23C 14/00
(52) U.S. Cl. ........................................ 430/5; 204/192.12
(58) Field of Search ............................ 430/5, 322, 324; 428/432, 698; 427/595, 376.1, 376.2; 204/192.12, 192.15; 438/636

(56) References Cited

U.S. PATENT DOCUMENTS

| | | |
|---|---|---|
| 4,363,846 A | 12/1982 | Kaneki |
| 4,374,912 A | 2/1983 | Kaneki et al. |
| 4,530,891 A | 7/1985 | Nagarekawa et al. |
| 4,563,407 A | 1/1986 | Matsui et al. |
| 4,657,648 A | 4/1987 | Nagarekawa et al. |
| 4,696,877 A | 9/1987 | Matsui et al. |
| 5,474,864 A | 12/1995 | Isao et al. |
| 5,629,114 A | 5/1997 | Isao et al. |
| 5,674,647 A | 10/1997 | Isao et al. |
| 5,691,090 A | 11/1997 | Isao et al. |
| 5,830,607 A | 11/1998 | Isao et al. |

FOREIGN PATENT DOCUMENTS

| | | |
|---|---|---|
| EP | 0 090 924 | 10/1983 |
| JP | 61-46821 | 10/1986 |
| JP | 62-18560 | 1/1987 |
| JP | 62-27386 | 6/1987 |
| JP | 62-27387 | 6/1987 |
| JP | 62-32782 | 7/1987 |
| JP | 62-37384 | 8/1987 |
| JP | 62-37385 | 8/1987 |
| JP | 62-59296 | 12/1987 |
| JP | 4-1339 | 1/1992 |
| JP | 7-43888 | 2/1995 |
| JP | 7-140635 | 6/1995 |

OTHER PUBLICATIONS

English Abstract of JP–B 62–37385.
English Abstract of JP–B 62–27386.
English Abstract of JP–B 4–1339.
English Abstract of JP–B 62–37384.
English Abstract of JP–A 62–18560.
English Abstract of JP–A 7–433888.

*Primary Examiner*—S. Rosasco
(74) *Attorney, Agent, or Firm*—Millen, White, Zelano & Branigan, P.C.

(57) ABSTRACT

A photomask blank has at least one layer of chromium base film on a transparent substrate. The chromium base film of chromium oxycarbide (CrCO) or chromium oxynitride carbide (CrCON) is formed by a reactive sputtering technique using chromium or chromium containing O, N or C as the target and a mixture of carbon dioxide gas and an inert gas as the sputtering gas. A photomask is manufactured by lithographically patterning the photomask blank. The photomask blank and photomask are of quality featuring high uniformity within the substrate plane and ease of control during manufacture.

6 Claims, 3 Drawing Sheets

PHOTOMASK BLANK, PHOTOMASK AND METHOD OF MANUFACTURE

The present invention relates to a photomask blank and a photomask for typical use in the microfabrication of high density semiconductor integrated circuits such as LSI and VLSI, color filters for charge coupled devices (CCD) and liquid crystal devices (LCD), and magnetic heads. It also relates to a method of manufacturing the same.

BACKGROUND OF THE INVENTION

Photolithography using photomasks is employed for the microfabrication of high density semiconductor integrated circuits such as LSI and VLSI, color filters for charge coupled devices (CCD) and liquid crystal devices (LCD), magnetic heads, and the like.

In general, the photomask is prepared from a photomask blank in which a light-shielding film typically in the form of a chromium base film is formed on a transparent substrate of quartz glass or aluminosilicate glass as by sputtering or vacuum evaporation. A predetermined pattern is formed in the chromium base light-shielding film, resulting in the photomask.

JP-B 62-37385 discloses a photomask blank comprising on a substrate a chromium film serving as the light-shielding film wherein CrO is formed on the surface of the chromium film for antireflection purposes and another antireflection film is formed on the substrate side. There were proposed a variety of antireflection films including CrON (JP-B 61-46821 and JP-B 62-32782) and CrN (JP-B 62-27386 and JP-B 62-27387). Also JP-B 4-1339 discloses a single layer film of CrN and JP-B 62-37384 discloses a multilayer film of Cr+CrN+CrON.

For further microfabrication purposes, a method of processing to a finer pattern using a phase shift film that utilizes optical interference is practiced. For example, JP-A 7-140635 uses an oxygen-doped chromium film or molybdenum silicide film alone as the phase shift film. JP-B 62-59296 discloses a combination of a light-shielding film with a phase shift film. JP-A 62-18560 discloses the use of chromium alone or chromium in admixture with at least one of oxygen, nitrogen and carbon as the film material. JP-A 7-43888 discloses film deposition by reactive sputtering using oxygen and $CH_4$ as the reactive gas.

In the prior art of photomask blanks and photomasks, it is thus known to add oxygen to a chromium film and to form an oxygen-containing chromium film on a light-shielding film. The oxygen-containing chromium film is usually prepared by introducing oxygen gas as the oxygen source into a deposition chamber. The use of oxygen gas as the oxygen source, however, has the problem that optical properties such as transmittance, reflectance and refractive index tend to vary within the plane of substrate. The use of nitrogen monoxide gas as the oxygen source is also proposed in JP-B 62-37385, but suffers from the same problem.

The use of oxygen gas as the oxygen source also has the problem of low production yield in that because of the high reactivity of oxygen gas, optical properties are sensitive to variations of gas flow rate, which precludes consistent mass production. An attempt to control film properties encounters difficulty, because the film quickly becomes an oxide film when the oxygen flow rate exceeds a certain level. Then the control of film quality becomes impossible and the rate of deposition rapidly declines.

SUMMARY OF THE INVENTION

An object of the invention is to provide a photomask blank and a photomask of quality which have high uniformity of optical properties within the plane of substrate and can be consistently manufactured because of ease of control of deposition of a chromium base film. Another object of the invention is to provide methods for preparing the photomask blank and the photomask.

It has been found that when reactive sputtering is effected using chromium or chromium containing at least one element of oxygen, nitrogen and carbon as the target and a mixture of carbon dioxide gas and an inert gas as the sputtering gas, a chromium base film is formed on a substrate to high uniformity of optical properties within the plane of the substrate. The deposition of the chromium base film under these conditions ensures ease of control and consistent mass production. Specifically, a chromium base film of chromium oxycarbide (CrCO) or chromium oxynitride carbide (CrCON) can be formed to high quality, effectively overcoming the problems of the prior art.

In one aspect, the invention provides a photomask blank comprising a transparent substrate and at least one layer of chromium base film thereon, wherein the chromium base film has been formed by reactive sputtering using chromium or chromium containing at least one element of oxygen, nitrogen and carbon as the target and a sputtering gas containing at least carbon dioxide gas and an inert gas. The chromium base film is preferably comprised of chromium oxycarbide (CrCO) or chromium oxynitride carbide (CrCON). The invention also provides a photomask manufactured by lithographically patterning the photomask blank.

In another aspect, the invention provides a method of manufacturing a photomask blank having at least one layer of chromium base film on a transparent substrate, comprising the step of effecting reactive sputtering using chromium or chromium containing at least one element of oxygen, nitrogen and carbon as the target and a sputtering gas containing at least carbon dioxide gas and an inert gas, for forming the chromium base film. The chromium base film is preferably comprised of chromium oxycarbide (CrCO) or chromium oxynitride carbide (CrCON). By lithographically patterning the photomask blank, a photomask is manufactured.

When a chromium base oxide film is deposited on a transparent substrate by a reactive sputtering technique, the invention recommends to use carbon dioxide gas as the oxygen source. Since carbon dioxide is less reactive than oxygen, the gas can uniformly spread and distribute in the chamber over its full extent so that the chromium base film being deposited becomes of uniform quality.

The film deposition by sputtering using carbon dioxide gas as the oxygen source can minimize the non-uniformity of optical properties within the substrate plane for the following reason. In the process of flowing oxygen or another reactive gas capable of reacting with chromium into a deposition chamber from its inlet, variations of reflectance arise because oxygen is successively consumed for oxidation from a position nearer to the inlet, that is, the degree of oxidation is higher at a position nearer to the inlet. When oxygen is fed from without the target, oxygen is consumed on the outside of the target so that the concentration of oxygen lowers toward the inside, resulting in the degree of oxidation varying within the plane to produce a distribution of optical constant.

In contrast, the invention uses carbon dioxide gas as the oxygen source in reactive sputtering. Since the low reactivity carbon dioxide gas is little consumed until it is activated by a plasma, it can uniformly spread around in the chamber so that a film being deposited may have a more uniform degree of oxidation. As a result, the uniformity of optical properties within the substrate plane are drastically improved. Film properties can be controlled by using both carbon dioxide gas and an inert gas as the sputtering gas and adjusting the mixing ratio therebetween.

The control of film composition is facilitated by the simultaneous use of carbon dioxide gas and an inert gas as the sputtering gas. Also because of the low reactivity, the carbon dioxide gas allows for a greater margin against unexpected variations of many parameters associated with the deposition process. Then the chromium base film can be deposited in a stable and controllable manner without decreasing a deposition rate. Also advantageously, reflectance can be reduced.

BRIEF DESCRIPTION OF THE DRAWINGS

The above and other objects, features and advantages of the invention will become more apparent from the following detailed description, taken in conjunction with the accompanying drawings.

FIG. 3 illustrates in sectional view the method of manufacturing a photomask according to the invention.

DESCRIPTION OF THE PREFERRED EMBODIMENT

Figure 1:
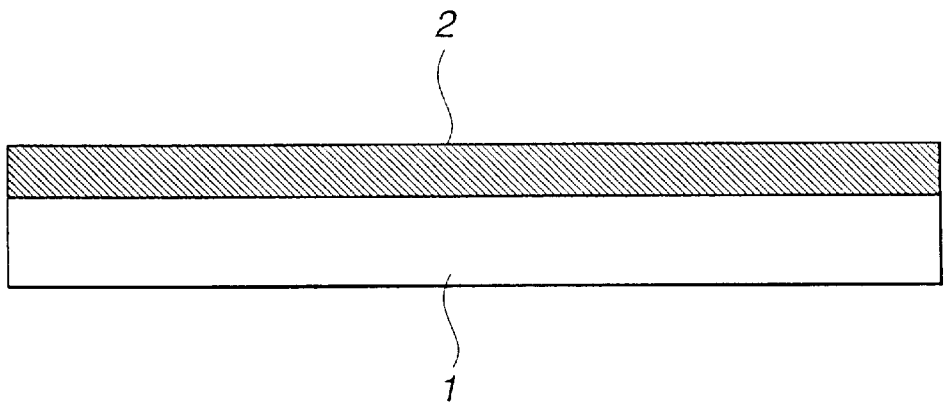
FIG. 1 is a sectional view of a photomask blank according to one embodiment of the invention.

Referring to FIG. 1, the photomask blank of the invention is illustrated as comprising a substrate 1 and a chromium base film 2 formed thereon. The substrate 1 is made of a material such as quartz or $CaF_2$ that is transparent to the exposure light. The chromium base film 2 is deposited on the substrate by reactive sputtering using chromium or chromium containing at least one element of oxygen, nitrogen and carbon as the target and a sputtering gas containing at least carbon dioxide gas and an inert gas. The film 2 is typically composed of chromium oxycarbide (CrCO) or chromium oxynitride carbide (CrCON).

Preferably the chromium base film is structured as at least one layer of chromium oxycarbide (CrCO) or chromium oxynitride carbide (CrCON) which is deposited on a transparent substrate by a reactive sputtering technique using a sputtering gas containing carbon dioxide gas as the oxygen source.

The preferred composition of chromium oxycarbide (CrCO) consists essentially of 20 to 95 at %, especially 30 to 80 at % of Cr, 1 to 60 at %, especially 5 to 50 at % of C, and 1 to 60 at %, especially 5 to 50 at % of O. The preferred composition of chromium oxynitride carbide (CrCON) consists essentially of 20 to 95 at %, especially 30 to 80 at % of Cr, 1 to 20 at %, especially 2 to 15 at % of C, 1 to 60 at %, especially 5 to 50 at % of O, and 1 to 30 at %, especially 3 to 30 at % of N.

The method of forming the chromium base film is a reactive sputtering technique. The target used herein for sputtering is chromium. Chromium having added thereto oxygen, nitrogen, carbon or mixtures of any may be used, if necessary.

The sputtering technique may employ either a direct-current power supply (d.c. sputtering) or a high-frequency power supply (RF sputtering). The use of magnetron sputtering or conventional sputtering is also possible.

The sputtering gas has a composition comprising at least an inert gas such as argon or krypton and carbon dioxide gas. The flow ratio of inert gas to carbon dioxide varies with the sputtering apparatus, power and other factors, although the ratio by volume is preferably from about 1:0.01 to about 1:100, more preferably from about 1:0.02 to about 1:50. Besides the inert gas and carbon dioxide gas, a nitrogen-providing gas such as nitrogen gas or various nitrogen oxide gases can be added to the sputtering gas so that the chromium base film being deposited may have the desired composition of CrCON.

In the manufacture of the photomask blank, the non-uniformity within the substrate plane of optical properties of the deposited chromium base film can be minimized by using carbon dioxide gas as the oxygen source. Preferably the photomask blank of the invention has a variance D of reflectance of up to 0.1, and more preferably up to 0.05, which indicates uniform optical properties as compared with conventional CrCO and CrCON films having a variance D of more than 0.2. It is understood that the variance D of reflectance is expressed by the following equation:

$$D = (max - min)/(max + min)$$

wherein "max" is a maximum measured reflectance and "min" is a minimum measured reflectance. For example, when the in-plane distribution of reflectance at a spacing of 5 mm is determined by measuring a reflectance at a wavelength of 400 to 450 nm by means of NANOSPEC by NANOMETRICS Co., the variance D of the reflectance within the substrate plane, as expressed by the above equation, is up to 0.1, more preferably up to 0.05.

Figure 2:
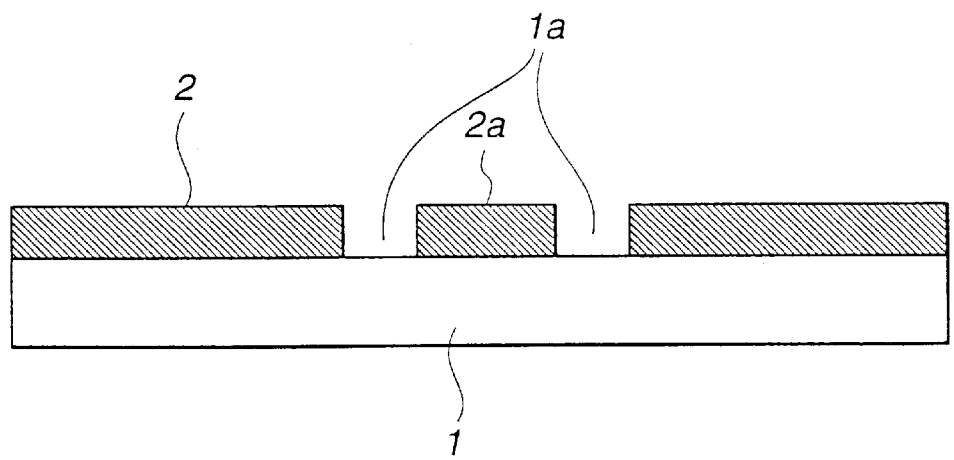
FIG. 2 is a sectional view of a photomask obtained therefrom.
Figure 3A:
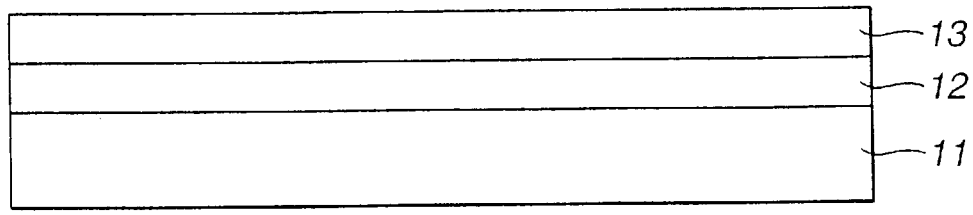
FIG. 3A shows the photomask blank on which a resist film has been formed.
Figure 3B:
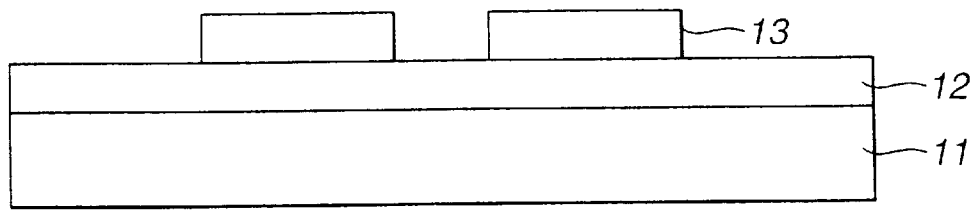
FIG. 3B shows the structure after the resist film has been patterned.
Figure 3C:
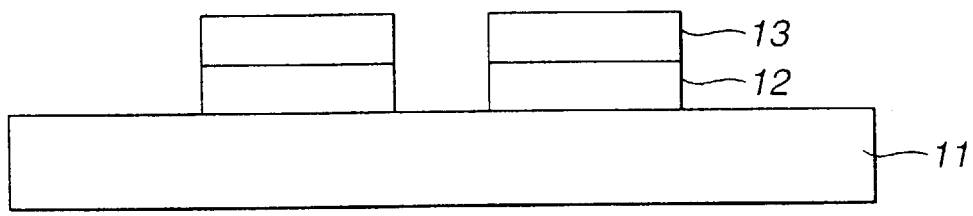
FIG. 3C shows the structure after dry etching.
Figure 3D:
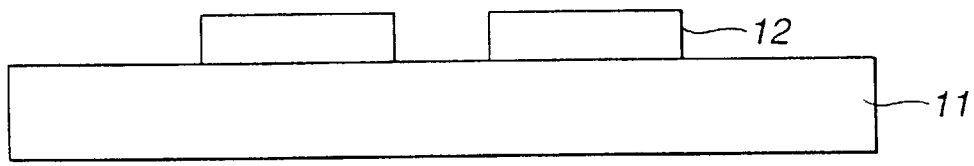
FIG. 3D shows the structure after the resist film has been removed.

FIG. 2 shows a photomask which is obtained by lithographically patterning the chromium base film 1 of the photomask blank shown in FIG. 1. Patterned sections 2a of the chromium base film are separated by etched areas 1a where the substrate 1 is exposed.

The photomask is manufactured from the photomask blank by the method according to the invention, which is illustrated in FIG. 3. As shown in FIG. 3A, a resist film 13 is formed on a CrCO or CrCON layer 12 which has been formed on a substrate 11 as mentioned above. The resist film 13 is patterned as shown in FIG. 3B. The CrCO or CrCON layer 12 is then dry or wet etched as shown in FIG. 3C. Then the resist film 13 is stripped off as shown in FIG. 3D. In this process, application of the resist film, patterning (exposure and development), dry or wet etching, and removal of the resist film may be carried out by known methods.

The chromium base film is not limited to a single layer film, but can be formed as a multilayer film having two or more layers. In case that CrCO film or CrCON film is used as a part of the multilayer film, included are a structure in which an antireflection film in the form of a CrCO or CrCON film is formed on a light shielding film; a structure in which antireflection films are formed on both the surfaces of a light shielding film which are disposed adjacent to and remote from the substrate, either one or both of the antireflection films being CrCO or CrCON films; and a structure having two or three layers of different CrCO and/or CrCON compositions, each layer serving the function of a light shielding or antireflection film, so that a light shielding film and an antireflection film are stacked on the substrate, an antireflection film and a light shielding film are stacked on the substrate, or an antireflection film, a light shielding film and an antireflection film are stacked on the substrate, in the described order. Alternatively, some or all of a conductive film and a film consisting of a single layer or two or more layers serving as a light shielding film or antireflection film are formed as CrCO or CrCON films on the phase shifter film, thereby constructing a photomask or photomask blank of the phase shift type. Illustrative film structures include a structure having stacked on the substrate a phase shift film, an antireflection film, a light shielding film and an antireflection film, a structure having stacked on the substrate a phase shift film, a light shielding film and an antireflection film, and a structure having stacked on the substrate a phase shift film, an antireflection film and a light shielding film, in the described order. The invention is also applicable to a phase shifter film of the halftone type using chromium.

EXAMPLES

The following examples are provided by way of illustration, and are not intended to limit the scope of the invention.

Example 1

Figure 4:
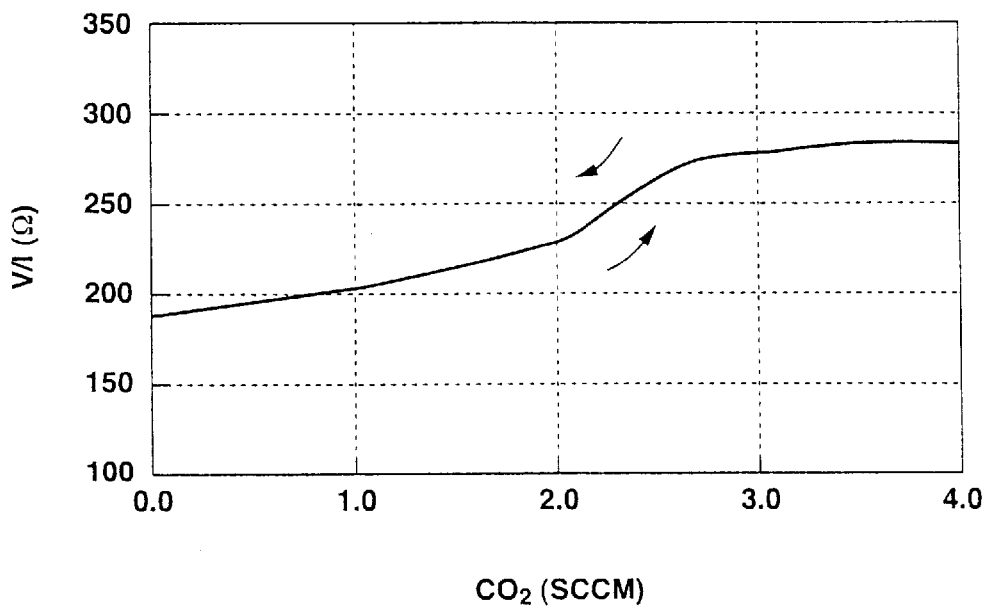
FIG. 4 is a graph showing the discharge resistance versus the flow rate of $CO_2$ in Example 1.

Using a 6" quartz substrate, a 8" chromium target and a mixture of Ar and $CO_2$ in a varying flow ratio and in a total flow rate of 7 sccm as the sputtering gas, DC magnetron sputtering was carried out under conditions including a gas pressure of 0.3 Pa during discharge, a power of 500 W, and a temperature of 120° C. prior to deposition. The discharge characteristics are depicted in the graph of FIG. 4 which shows a moderate change of discharge resistance. The reflectance of light at wavelength 450 nm could be readily adjusted from about 10% to about 50 or 60% without a substantial lowering of deposition rate.

Comparative Example 1

Figure 5:
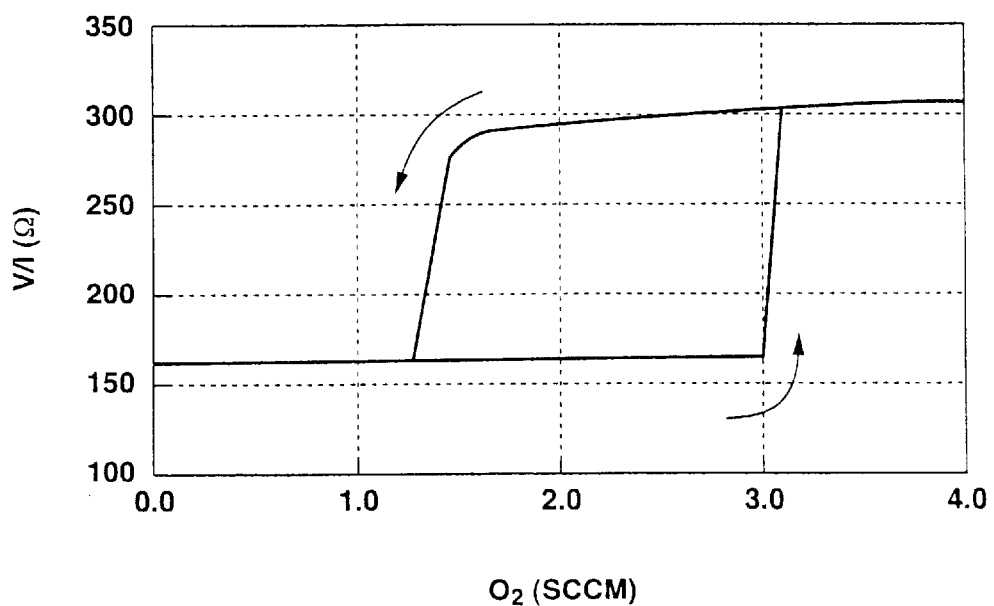
FIG. 5 is a graph showing the discharge resistance versus the flow rate of $O_2$ in Comparative Example 1.

Using a 6" quartz substrate, a 8" chromium target and a mixture of Ar and $O_2$ in a varying flow ratio and in a total flow rate of 7 sccm as the sputtering gas, DC magnetron sputtering was carried out under conditions including a gas pressure of 0.3 Pa during discharge, a power of 500 W, and a temperature of 120° C. during deposition. The discharge characteristics are depicted in the graph of FIG. 5 which shows jumps or sudden changes of discharge resistance. At small values of discharge resistance, the reflectance of light at wavelength 450 nm is as high as 50 to 60%, but at large values of discharge resistance, the reflectance is as low as about 10%. It was difficult to control a desired value of reflectance. The deposition rate was as high as 12 Å/sec when the reflectance was high, but became as low as 2 Å/sec when the reflectance was low.

Example 2

By using a 6" quartz substrate and a 8" chromium target and flowing 4.5 sccm of Ar and 2.5 sccm of $CO_2$ as the sputtering gas, DC magnetron sputtering was carried out under conditions including a gas pressure of 0.3 Pa during discharge, a power of 500 W, and a temperature of 120° C. during deposition. A CrCO film of 300 nm thick was deposited, which had a reflectance of about 30%. The deposition rate was 7 Å/sec.

When the in-plane distribution of reflectance of the CrCO film at a spacing of 5 mm was determined by measuring a reflectance at a wavelength of 450 nm by means of NANO-SPEC by NANOMETRICS Co., the variance D was 0.032, as expressed by the following equation:

$$D=(max-min)/(max+min)$$

wherein "max" is a maximum measured reflectance and "min" is a minimum measured reflectance.

The film composition of this film was analyzed by electron spectroscopy for chemical analysis (ESCA), finding that it contained 59 at % of Cr, 9 at % of C, and 32 at % of O. The results are shown in Table 1.

Example 3

By using a 6" quartz substrate and a 8" chromium target and flowing 3.5 sccm of Ar, 2.0 scam of $CO_2$ and 1.5 scam of $N_2$ as the sputtering gas, DC magnetron sputtering was carried out under conditions including a gas pressure of 0.3 Pa during discharge, a power of 500 W, and a temperature of 120° C. during deposition. A CrCON film was deposited, which had a reflectance of about 30%. The deposition rate was 8 Å/sec.

When the in-plane distribution of reflectance of the CrCON film at a spacing of 5 mm was determined by measuring a reflectance at a wavelength of 450 nm by means of NANOSPEC, the variance D was similarly computed to be 0.019.

The film composition of this film was analyzed by ESCA, finding that it contained 51 at % of Cr, 6 at % of C, 20 at % of 0 and 23 at % of N. The results are shown in Table 1.

Comparative Example 2

By using a 6" quartz substrate and a 8" chromium target and flowing 3.7 scam of Ar and 3.3 sccm of $O_2$ as the sputtering gas, DC magnetron sputtering was carried out under conditions including a gas pressure of 0.3 Pa during discharge, a power of 500 W, and a temperature of 120° C. during deposition. A CrO film of 300 nm thick was deposited. The deposition rate was 2 Å/sec.

When the in-plane distribution of reflectance of the CrO film at a spacing of 5 mm was determined by measuring a reflectance at a wavelength of 450 nm by means of NANOSPEC, the variance D was similarly computed to be 0.23.

The film composition of this film was analyzed by ESCA, finding that it contained 37 at % of Cr and 63 at % of O. The results are shown in Table 1.

TABLE 1

| | | Sputtering gas (sccm) | | | | | Film composition (at %) | | | |
|---|---|---|---|---|---|---|---|---|---|---|
| | Target | Ar | $CO_2$ | $N_2$ | $O_2$ | Variance D | Cr | C | O | N |
| E2 | Cr | 4.5 | 2.5 | — | — | 0.032 | 59 | 9 | 32 | — |
| E3 | Cr | 3.5 | 2.0 | 1.5 | — | 0.019 | 51 | 6 | 20 | 23 |
| CE2 | Cr | 3.7 | — | — | 3.3 | 0.23 | 37 | — | 63 | — |

A comparison of Examples 2 and 3 with Comparative Example 2 reveals that the use of carbon dioxide gas as the oxygen source is effective for improving the variance of reflectance within the substrate plane by approximately one order, as compared with the use of oxygen gas.

With respect to film deposition, the use of carbon dioxide gas as the oxygen source allows for a greater margin against variations of many parameters associated with the deposition process than the use of oxygen gas. This ensures that films are deposited in a reproducible manner.

According to the invention, a chromium base film is deposited on a transparent substrate by reactive sputtering using a mixture of carbon dioxide gas and an inert gas as the sputtering gas. The resulting chromium base photomask blank and photomask are of quality in that they have the advantages of high uniformity within the substrate plane and ease of control during manufacture.

Japanese Patent Application No. 2000-037822 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A photomask blank comprising a transparent substrate and at least one layer of chromium base film thereon, wherein said chromium base film has been formed by reactive sputtering using chromium or chromium containing at least one element of oxygen, nitrogen and carbon as the target and a sputtering gas containing at least carbon dioxide gas and an inert gas.

2. The photomask blank of claim 1 wherein said chromium base film is comprised of chromium oxycarbide (CrCO) or chromium oxynitride carbide (CrCON).

3. A photomask manufactured by lithographically patterning the photomask blank of claim 1.

4. A method of manufacturing a photomask blank having at least one layer of chromium base film on a transparent substrate, comprising the step of effecting reactive sputtering using chromium or chromium containing at least one element of oxygen, nitrogen and carbon as the target and a sputtering gas containing at least carbon dioxide gas and an inert gas, for forming the chromium base film.

5. The method of claim 4 wherein said chromium base film is comprised of chromium oxycarbide (CrCO) or chromium oxynitride carbide (CrCON).

6. A method of manufacturing a photomask, comprising the step of lithographically patterning the photomask blank manufactured by the method of claim 4.

* * * * *